United States Patent
Lee

(10) Patent No.: US 7,675,171 B2
(45) Date of Patent: Mar. 9, 2010

(54) SEMICONDUCTOR PACKAGE AND FABRICATING METHOD THEREOF

(75) Inventor: In Lee, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 148 days.

(21) Appl. No.: 11/858,078

(22) Filed: Sep. 19, 2007

(65) Prior Publication Data

US 2008/0224308 A1 Sep. 18, 2008

(30) Foreign Application Priority Data

Oct. 2, 2006 (KR) ...................... 10-2006-0097307
Dec. 4, 2006 (KR) ...................... 10-2006-0121657

(51) Int. Cl.
*H01L 23/48* (2006.01)
(52) U.S. Cl. ............... 257/738; 257/618; 257/E23.191; 257/E23.194; 257/E23.002
(58) Field of Classification Search ................. 257/738, 257/E23.001, E23.194, E23.18, E23.191, 257/618
See application file for complete search history.

(56) References Cited

U.S. PATENT DOCUMENTS 6,959,856 B2   11/2005  Oh et al.
2004/0197979 A1*  10/2004  Jeong et al. ................. 438/202
2005/0104222 A1*  5/2005  Jeong et al. ................. 257/778
2005/0282315 A1   12/2005  Jeong et al.
2006/0091184 A1*  5/2006  Bayot et al. ............... 228/110.1

FOREIGN PATENT DOCUMENTS

| JP | 2006-19504 | 1/2006 |
|---|---|---|
| KR | 10-2005-0029602 | 3/2005 |
| KR | 10-2005-0116704 | 12/2005 |
| KR | 10-2006-0090180 | 8/2006 |
| KR | 10-2007-0050905 | 5/2007 |
| KR | 10-2007-0052257 | 5/2007 |

* cited by examiner

*Primary Examiner*—A. Sefer
*Assistant Examiner*—Allen L Parker
(74) *Attorney, Agent, or Firm*—Myers Bigel Sibley & Sajovec, P.A.

(57) ABSTRACT

Provided is a semiconductor device including a substrate, an electrode pad disposed on the substrate, an external terminal disposed on the electrode pad, a container extended from the electrode pad into the external terminal, and a conductive liquid disposed inside the container. The conductive liquid solidifies when exposed to air. When a crack forms in the external terminal, the container suppresses propagation of the crack. Further, if the crack breaches the container, the conductive liquid fills the crack, thereby minimizing further crack propagation and recovering the resistance characteristics of the external terminal prior to the crack formation. A method of forming a semiconductor device including a container having a conductive liquid is also provided.

17 Claims, 11 Drawing Sheets

SEMICONDUCTOR PACKAGE AND FABRICATING METHOD THEREOF

CROSS-REFERENCE TO RELATED APPLICATIONS

This application claims priority under 35 USC § 119 to Korean Patent Application No. 2006-097307, filed on Oct. 2, 2006, and No. 2006-121657, filed on Dec. 4, 2006, the contents of which are herein incorporated by reference in their entirety.

BACKGROUND

1. Technical Field

The disclosure relates to a semiconductor chip package and a system including the package. More particularly, the disclosure relates to a semiconductor chip package and a system including the package that is electrically and physically connected to a circuit board via an external terminal.

2. Description of the Related Art

As the microelectronics industry continues to develop increasingly complex devices with extremely small feature sizes, creating reliable interconnect systems becomes a significant challenge. A common method of attaching a chip package to a composite printed circuit board (PCB) is with a ball grid array (BGA) configuration. In this configuration, solder balls provide both the electrical and mechanical connection between the chip package and the PCB.

The process for coupling the chip package to the PCB typically includes one or more temperature cycles, such as a solder reflow step as an example. Also, reliability testing may simulate the operational environment of the resulting device by performing extreme temperature cycles. During these temperature cycles, a mismatch between the coefficient of thermal expansion (CTE) of the chip package substrate and the CTE of the PCB causes stress to be localized at the solder balls. The generated stress is proportional to both the CTE mismatch between the chip package substrate and the PCB and the change in temperature. Thus, large differences in CTE and large temperature variations lead to large stress localized at the solder balls. This localized stress can lead to cracks in the solder balls. Even small cracks can lead to an increase in the resistance of the solder ball connection, which may adversely affect the operational reliability of the resulting device. Specifically, when cracks occur in the solder ball, the effective area for electrical conduction is reduced, thereby increasing the resistance of the connection. However, if the cracks are allowed to propagate through the solder ball, by repeated temperature cycles for instance, the solder ball connection may completely fail, causing an open connection between the chip package and the PCB.

FIG. 1 is a micrograph showing a cracked solder ball 3 between a semiconductor chip package 2, having a bond pad 4, and a printed circuit board 6, having a contact pad 8. As shown in FIG. 1, the most likely point for a crack to be generated in a solder ball connection is one of the corners where the solder ball 3 couples to either the bond pad 4 or the contact pad 8. This is shown in details A and B of FIG. 1. However, cracks may form at center portions of the solder ball 3 as well. Also shown in FIG. 1, at detail C, is a crack that has propagated along the entire width of the solder ball 3. The cracks shown in details A, B, and C can lead to degradation of the solder connection, reduced reliability of the solder connection, and/or complete failure of the solder connection, each of which can lead to a device failure.

One method to minimize propagation of cracks in solder balls is disclosed in U.S. Pat. No. 6,959,856 to Oh et al ("Oh"). In Oh, a metal projection is embedded in a solder bump. The metal projection acts as an obstacle to crack propagation. However, although the structure of Oh may reduce crack propagation to prevent an open connection, it does not remedy the increase of resistance due to the cracks in the solder bump.

Consequently, a need remains for a method of minimizing crack propagation and minimizing the adverse effects on the resistance of the solder ball connection due to cracks.

SUMMARY

Embodiments of the present invention provide a semiconductor device including a substrate, an electrode pad disposed on the substrate, an external terminal disposed on the electrode pad, a container extended from the electrode pad into the external terminal, and a conductive liquid disposed inside the container. The conductive liquid solidifies when exposed to air. When a crack forms in the external terminal, the container suppresses propagation of the crack. Further, if the crack breaches the container, the conductive liquid fills the crack and may solidify in the crack if exposed to air. A method of forming a semiconductor device including a container having a conductive liquid is also provided.

According to embodiments of the invention, crack propagation within the external terminal is suppressed by the container. Further, if the crack breaches the container, the conductive liquid from the container fills the crack, restoring the resistance characteristics of the connection. Therefore, connections between chip packages and PCBs according to embodiments of the present invention have improved reliability over conventional methods.

BRIEF DESCRIPTION OF THE DRAWINGS

The above and other features and advantages of the invention will become more apparent by describing in detail exemplary embodiments thereof with reference to the accompanying drawings, in which.

DETAILED DESCRIPTION

Figure 1:
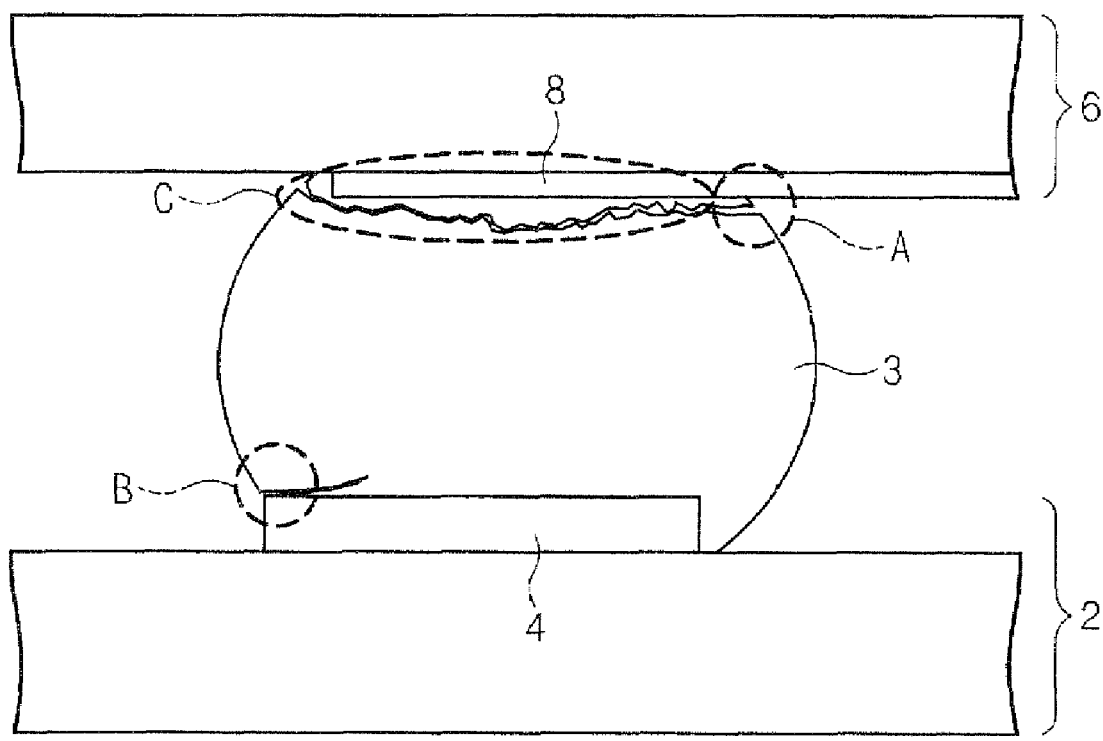
FIG. 1 is a micrograph showing a cracked solder ball between a semiconductor chip package and a printed circuit board.

The invention is described more fully hereinafter with reference to the accompanying drawings, in which various embodiments of the invention are shown. This invention may, however, be embodied in many different forms and should not be construed as limited to the particular embodiments set forth herein. Rather, these embodiments are provided so that this disclosure will be thorough and complete, and will convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
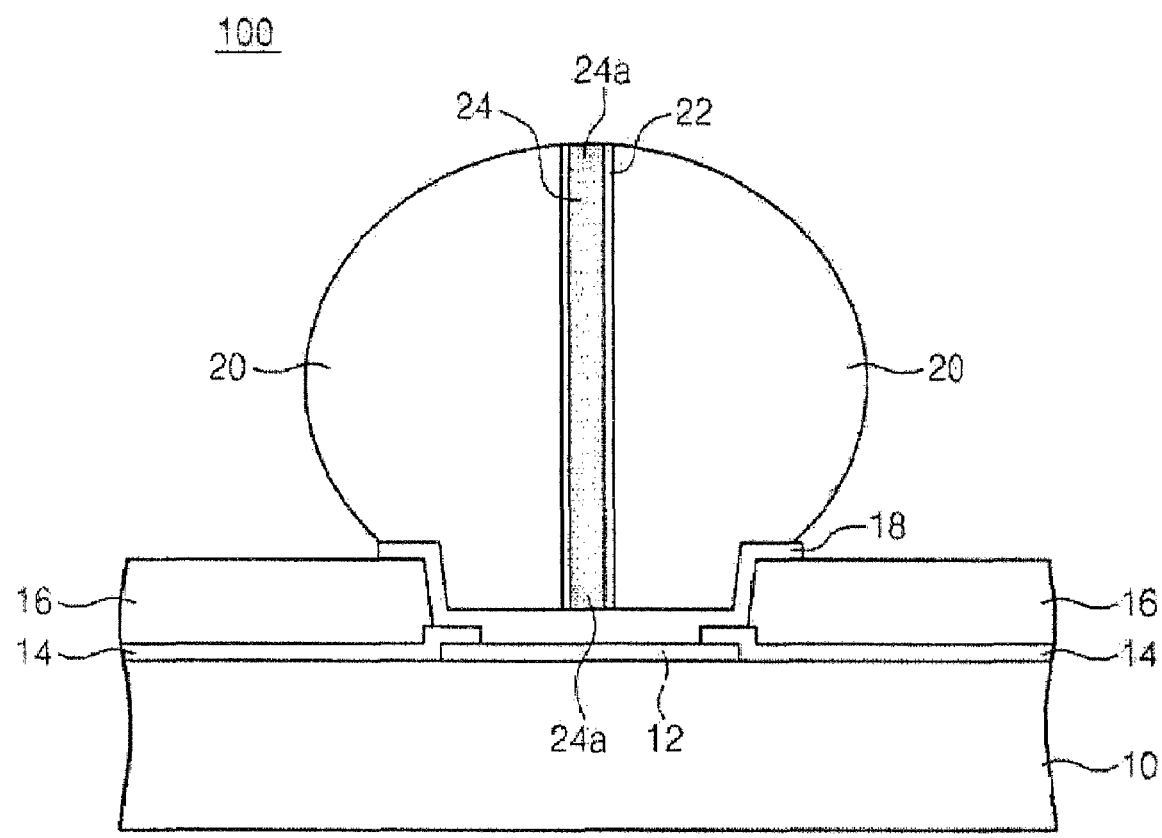
FIG. 2 is a cross-sectional view of an external terminal and elongated container according to some embodiments of the invention.

FIG. 2 is a cross-sectional view of an external terminal and elongated container according to some embodiments of the invention.

Referring to FIG. 2, a semiconductor chip package 100 according to some embodiments includes a semiconductor substrate 10, an electrode pad 12 disposed on the substrate 10, an external terminal 20 on the electrode pad 12, an elongated container 22 disposed in the external terminal 20, and a conductive liquid 24 inside the container 22. The substrate 10 may include a passivation layer 14 and an insulation layer 16. The insulation layer 16 defines an opening exposing the electrode pad 12. The insulation layer 16 may comprise an inorganic material such as a polyimide material.

The semiconductor chip package 100 may include an under-bump metallization (UBM) 18 disposed on the electrode pad 12. The UBM 18 may be included to improve wettability between the external terminal 20 and the electrode pad 12. The UBM 18 may include several thin layers and may comprise one or more of Cu, Au, Ni, Cr, and alloys thereof, and may be formed by conventional methods known in the art. The external terminal 20 may be a solder ball, a solder bump, a conductive ball, a conductive bump, or any other means for connecting a bond pad to a contact pad, as is known in the art.

Figure 3:
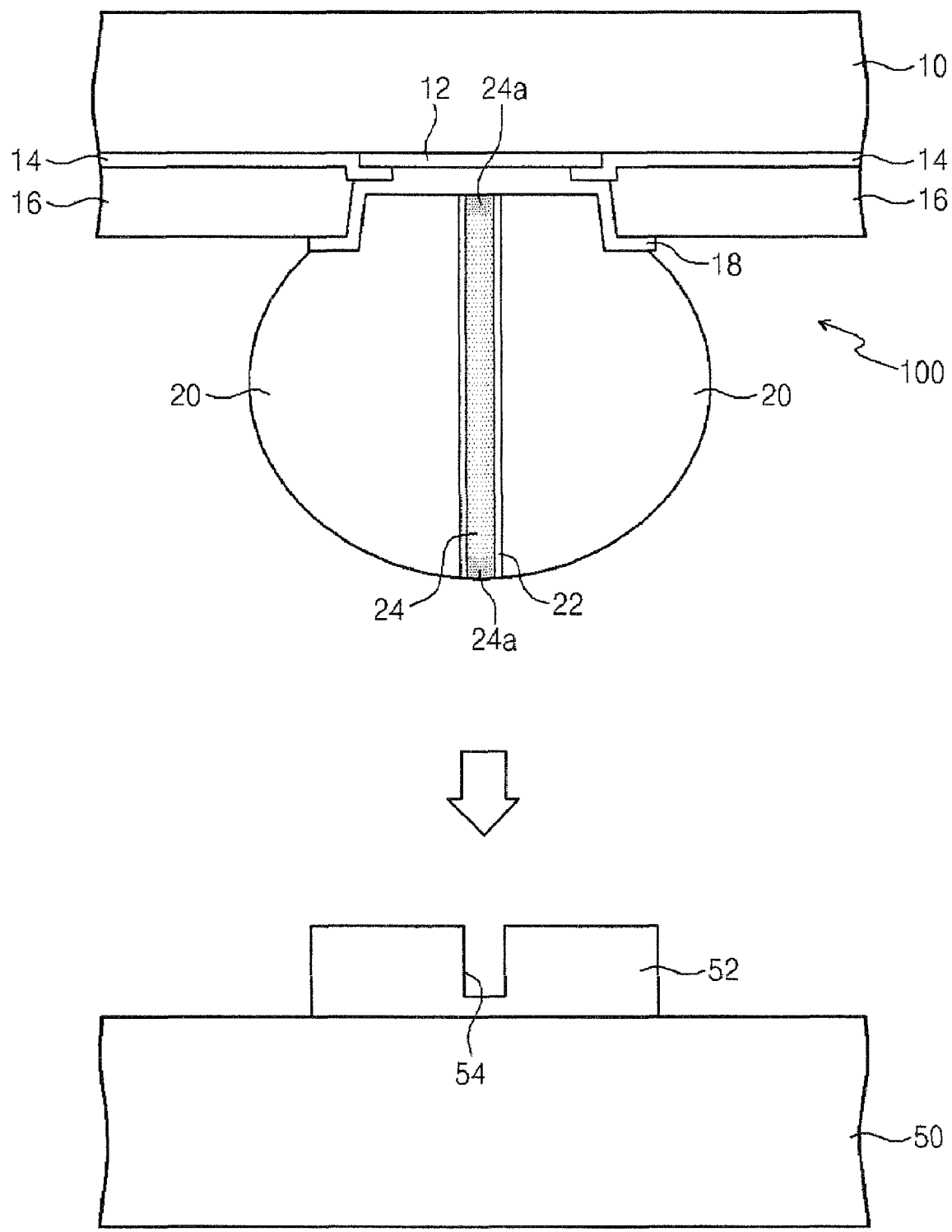
FIG. 3 is a cross-sectional view of an external terminal and elongated container joining a semiconductor chip package to a circuit board according to some embodiments of the invention.

The container 22 may be supported primarily by the external terminal 20 or it may be coupled to the electrode pad 12, the UBM 18, and/or a contact pad 52 (shown in FIG. 3). As explained further below, an end portion of the container 22 may be partially inserted into grooves in the electrode pad 12, the contact pad 52, or both. The end portion of the container 22 may also be embedded in the UBM 18 (not shown). The end portion of the container 22 may directly contacts a top surface of the UBM 18 as shown in FIG. 2, for example. The container 22 may have a substantially cylindrical shape. Alternatively, the container 22 may have any elongated shape that is capable of containing the conductive liquid 24 including, but not limited to, a rectangular hollow shape and a triangular hollow shape.

A portion 24a of the conductive liquid 24 may be formed by being exposed to air at one or both of the ends of the elongated container 22. The conductive liquid 24 may contain a conductive material such as a metal and solidifies when exposed to air. Consequently, the portion 24a of the conductive liquid 24 may be solid when exposed to air so as to seal the remaining conductive liquid 24 inside the container 22. Specifically, the portion 24a of the conductive liquid 24 will become solid when exposed to air, but the remaining conductive liquid 24 in the container 22 will remain in a liquid state unless it is exposed to air. The conductive liquid 24 may be a low viscosity, flowable material such as a metal paste, an electrically conductive ink, and nano-metal sol. For example, the conductive liquid 24 may be an electrically conductive ink or a nano-ink material such as that described in Korean Patent Nos. 10-20070043484, 10-20060011083, and 10-20070043436, the contents of which are herein incorporated by reference. According to some embodiments, the viscosity of the conductive liquid 24 may be about 10 cps to about 5000 cps. To form the conductive liquid with a suitable viscosity, an adhesive material may be added in the conductive liquid 24.

Figure 4:
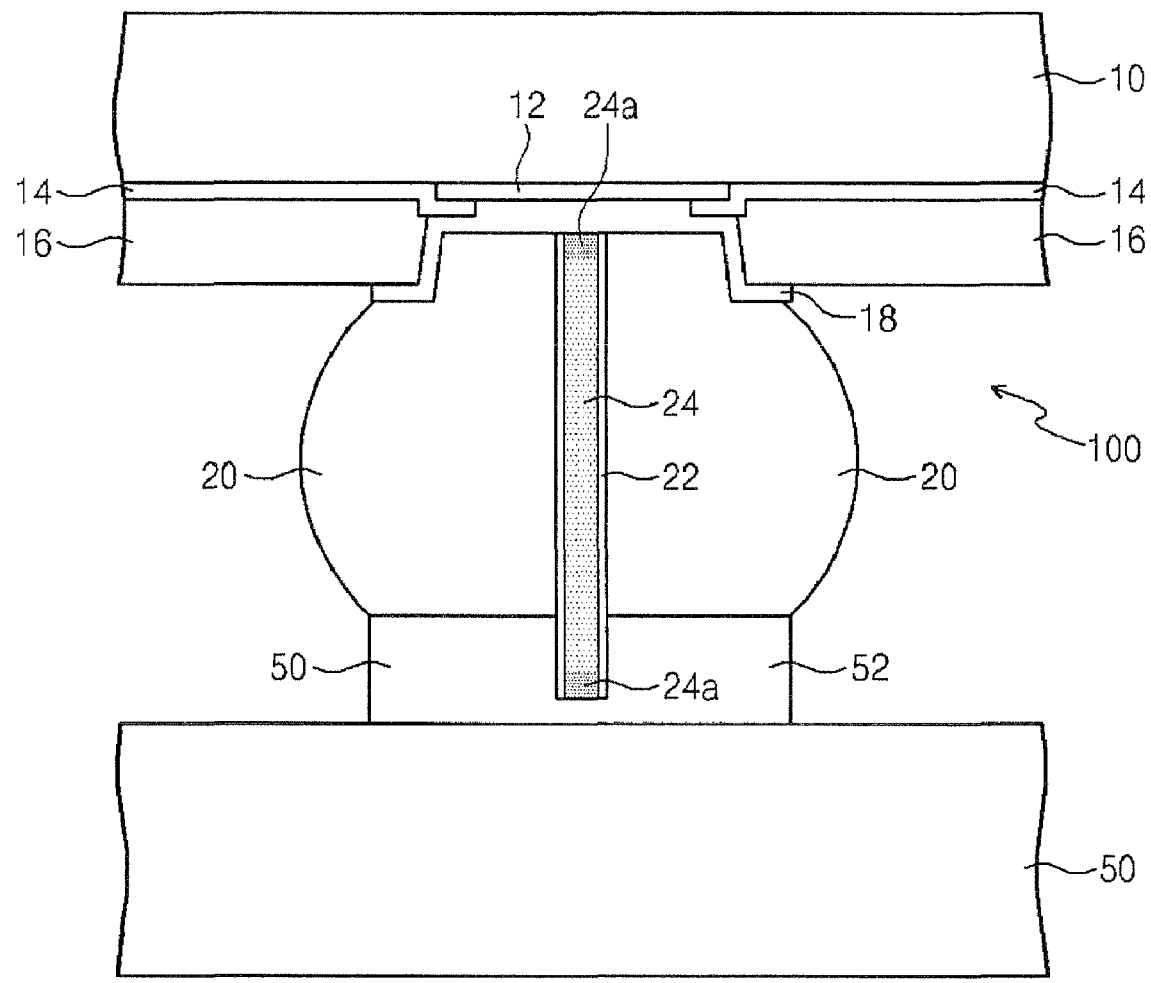
FIG. 4 is a cross-sectional view of a semiconductor chip package joined to a circuit board according to some embodiments of the invention.

FIG. 3 is a cross-sectional view of an external terminal and elongated container joining a semiconductor chip package to a circuit board according to some embodiments of the invention. FIG. 4 is a cross-sectional view of a semiconductor chip package joined to a circuit board according to some embodiments of the invention.

Figure 5:
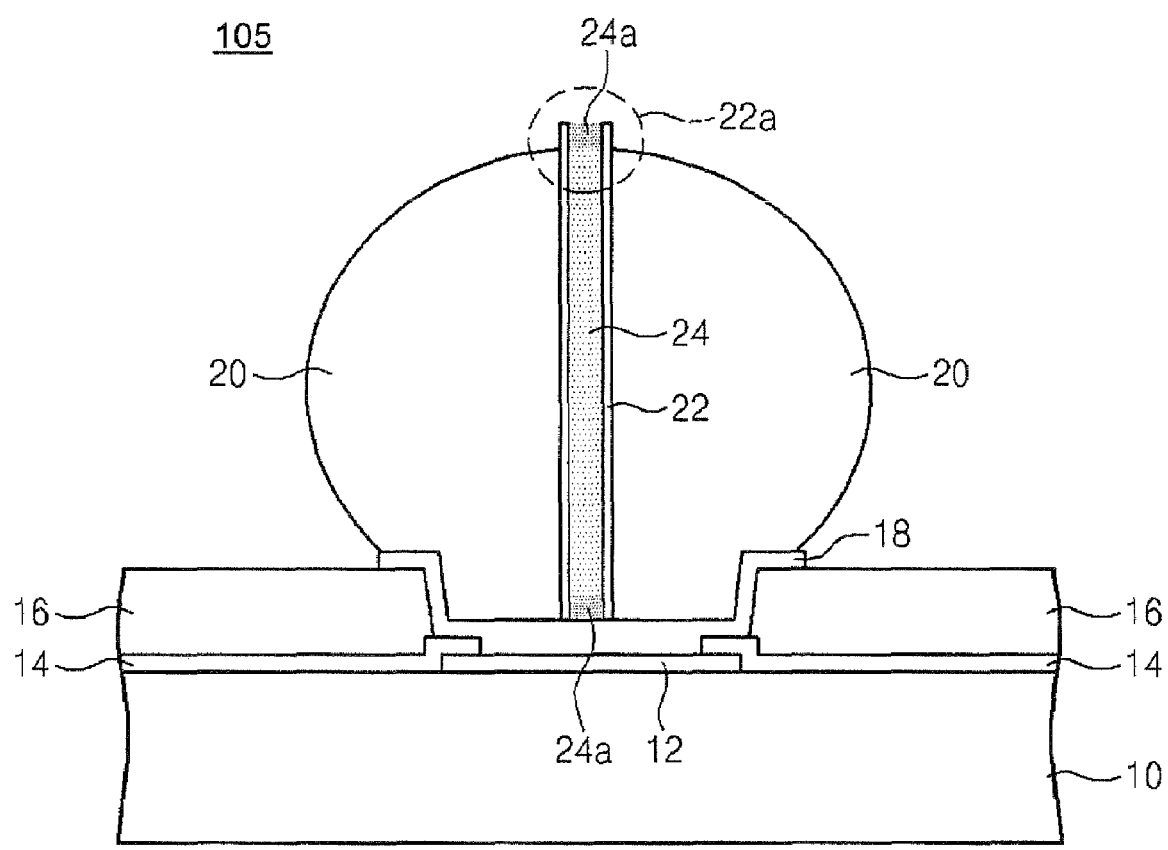
FIG. 5 is a cross-sectional view of an external terminal and elongated container according to some embodiments of the invention.

Referring to FIGS. 3 and 4, a semiconductor chip package 100 is joined to a circuit board 50 by the external terminal 20. The circuit board 50 may include a contact pad 52 to be coupled to the external terminal 20. The contact pad 52 may include a groove 54 and the elongated container 22 may extend into the groove 54 when the circuit board 50 is joined to the semiconductor chip package 100. The groove 54 may completely penetrate the contact pad 52 or it may only partially penetrate the contact pad 52. Specifically, the groove 54 may penetrate the contact pad 52 to a predetermined depth. The predetermined depth may correspond to an amount by which the container 22 protrudes from the external terminal 20, as shown in FIG. 5. The groove 54 may help to align the external terminal 20 to the contact pad 52 and may provide additional mechanical support for the container 22. Further, by engaging with the groove 54, the container 22 may provide resistance to sheer stress applied to the external terminal 20 by the semiconductor chip package 100 and the PCB 50. The contact pad 52 may comprise a conductive material, such as a metal, as is known in the art.

FIG. 5 is a cross-sectional view of an external terminal and elongated container according to some embodiments of the invention.

The semiconductor chip package 105 of FIG. 5 is similar to the semiconductor chip package of FIG. 2 except that the elongated container 22 of the semiconductor chip package 105 includes a portion 22a that extends above the top surface of the external terminal 20. The portion 22a of the container 22 may engage with a groove 54 (as shown in FIG. 3) in a circuit board 50, as discussed above. In this way, the portion 22a of the container 22 extending outside the surface of the external terminal 20 may act to stabilize the connection between the semiconductor chip package 105 and the PCB 50. Also, the extending portion 22a may help to align the semiconductor chip package 105 with the PCB, for example, when they are joined together. The portion 24a of the conductive liquid 24 may solidify in the portion 22a of the container 22 when exposed to air.

Figure 6:
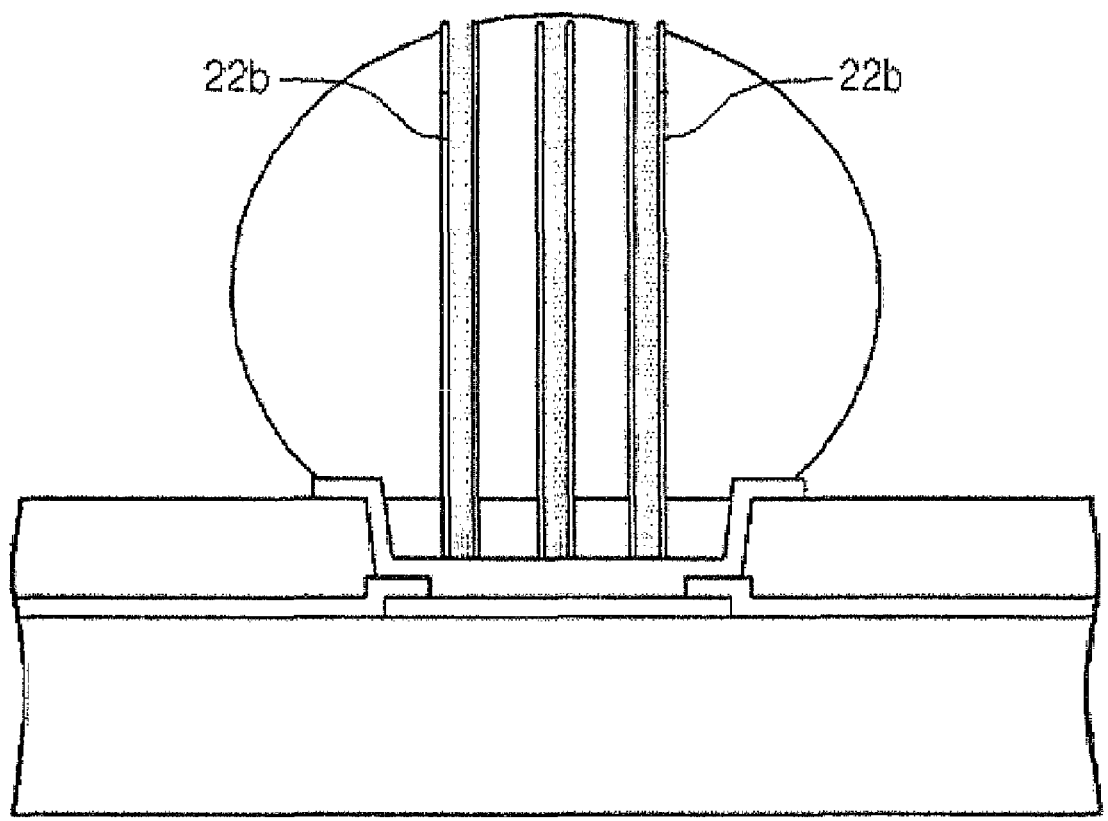
FIG. 6 is a cross-sectional view of a semiconductor chip package including an external terminal and multiple protrusions in accordance with an embodiment of the invention.

FIG. 6 is a cross-sectional view of a semiconductor chip package including an external terminal and multiple protrusions or elongated containers in accordance with an embodiment of the invention.

Referring to FIG. 6, a semiconductor chip package 100 may include an elongated container 22 and protrusions 22b. The protrusions 22b may be elongated containers similar to elongated container 22 and contain conductive liquid. The conductive liquid inside the protrusions 22b may be the same material as in the elongated container 22 or it may be a different material. Alternatively, the protrusions 22b may be substantially entirely solid, and made of either conductive or non-conductive materials.

Figure 7:
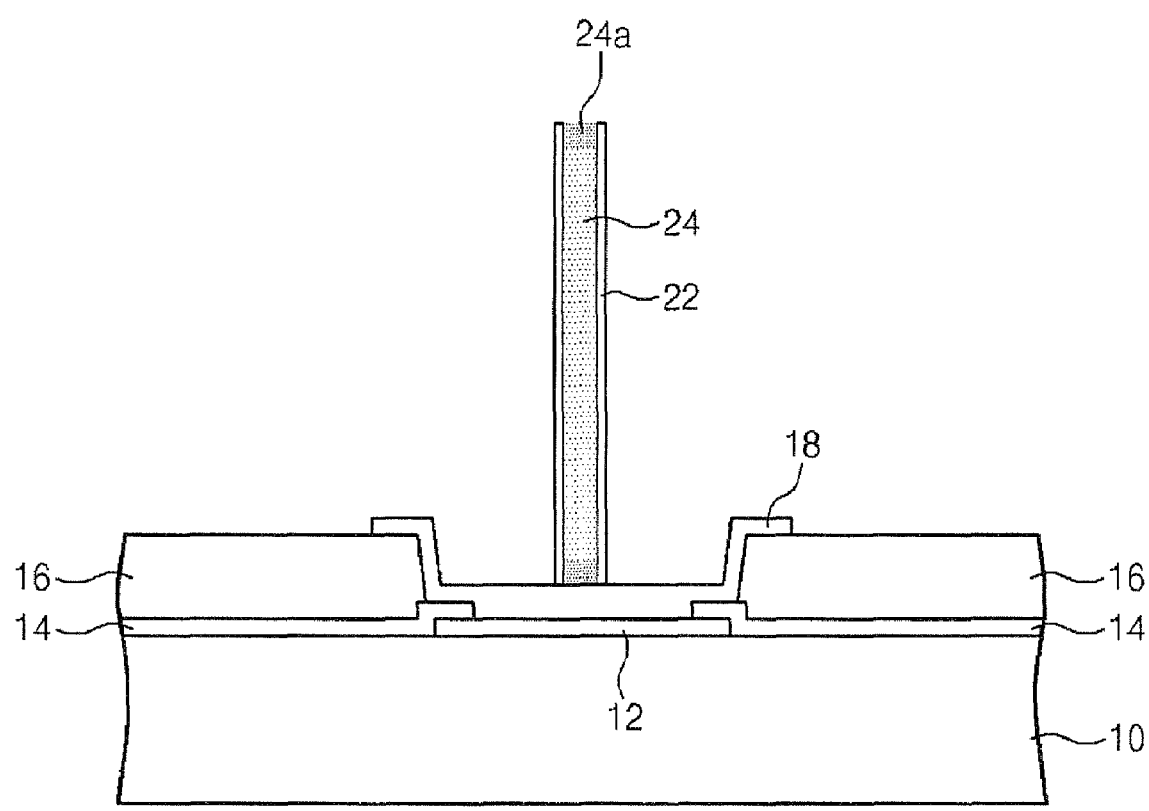
FIG. 7 is a cross-sectional view of a semiconductor chip package with an elongated container formed on the electrode pad according to some embodiments of the invention.

FIG. 7 is a cross-sectional view of a semiconductor chip package with an elongated container formed on the electrode pad according to some embodiments of the invention.

Referring to FIG. 7, a method for manufacturing a semiconductor chip package may include providing an elongated container 22 on an electrode pad 12. The electrode pad 12 may include a UBM 18, in which case the elongated container 22 is provided on the UBM 18. The electrode pad 12 and/or the UBM 18 may include a groove and the elongated container 22 may extend into the groove to improve adhesion therebetween. Specifically, either or both of the electrode pad 12 and the UBM 18 may include a groove (not shown) and the container 22 may extend into the groove. The elongated container 22 may be filled with a conductive liquid 24 prior to being provided on the electrode pad 12 and may be cut to a desired length. Conductive liquid 24 exposed by cutting the elongated container 22 may solidify when exposed to air, thereby sealing the end of the container 22. The container 22 may be formed by providing a copper sheet, rolling the copper sheet into a cylinder, and plating the cylinder with nickel, among other methods.

Figure 8:
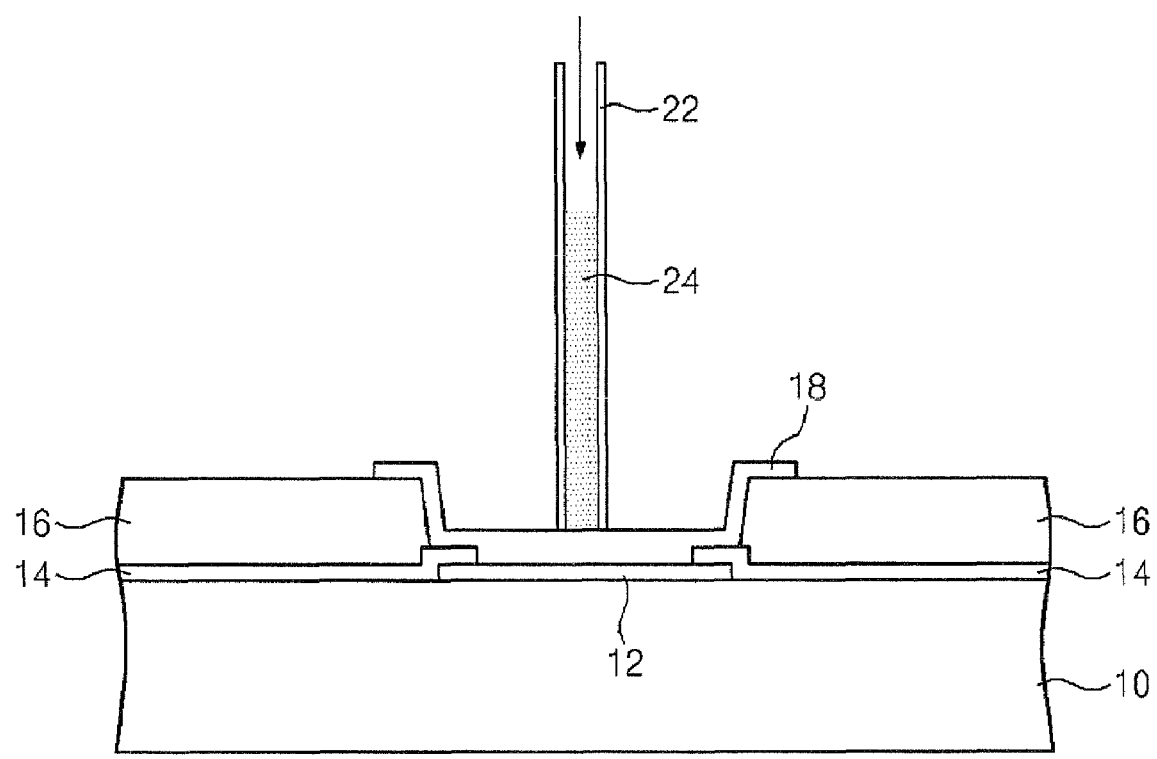
FIG. 8 is a cross-sectional view of a semiconductor chip package with a partially-filled elongated container formed on the electrode pad according to some embodiments of the invention.

FIG. 8 is a cross-sectional view of a semiconductor chip package with a partially-filled elongated container formed on the electrode pad according to some embodiments of the invention.

Referring to FIG. 8, a method for manufacturing a semiconductor chip package may include providing an elongated container 22 on an electrode pad 12 provided on a semiconductor substrate 10. The electrode pad 12 may include a UBM 18, in which case the elongated container 22 is provided on the UBM 18. The electrode pad 12 and/or the UBM 18 may include a groove and the elongated container 22 may extend into the groove to improve adhesion therebetween. The elongated container 22 may initially be a hollow container that is subsequently filled with a conductive liquid 24, for example, after being provided on the electrode pad 12. The elongated container 22 may be filled with the conductive liquid 24 by injecting the conductive liquid 24 into the container 22. The conductive liquid 24 may be injected into the container 22 by utilizing a differential pressure between the inside of the container 22 and the outside of the container 22. Using this differential pressure method may minimize the occurrence of air bubbles in the container 22. Conductive liquid 24 exposed to air after filling may solidify. In other words, the conductive liquid 24 exposed to air after the container 22 is filled may solidify, thereby sealing the end of the container 22.

Figure 9:
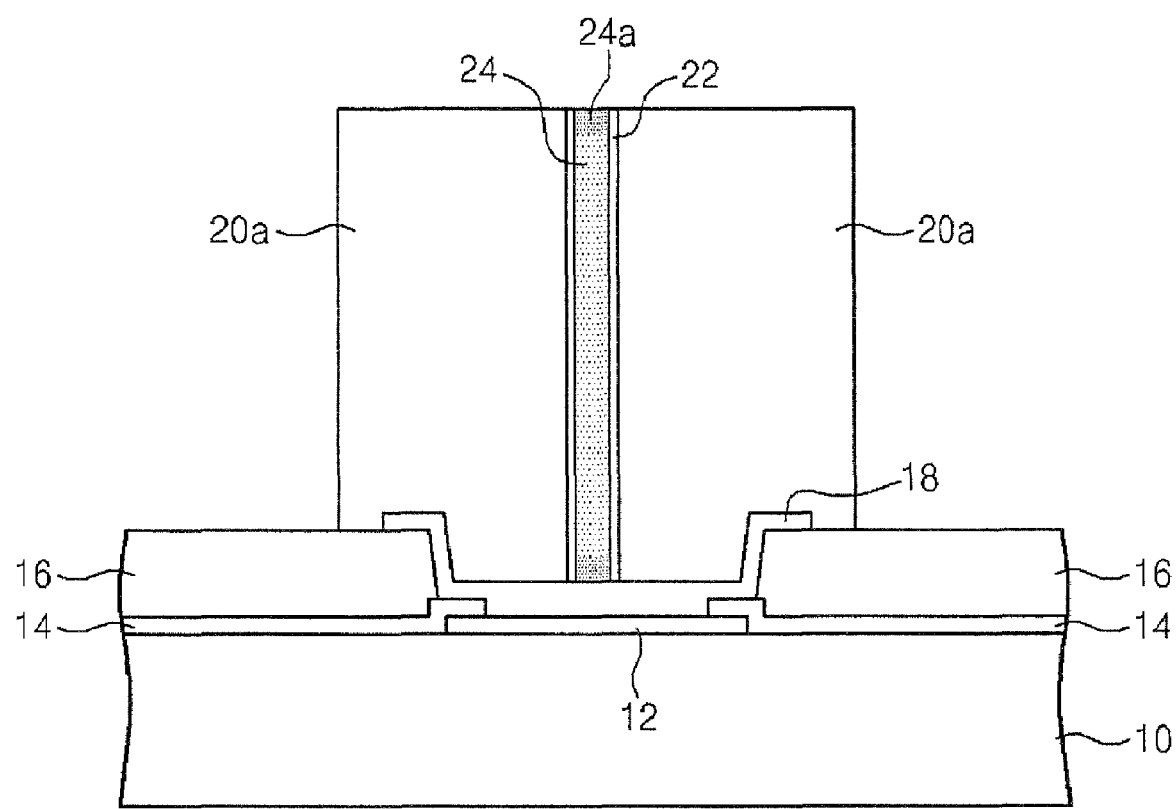
FIG. 9 is a cross-sectional view of a semiconductor chip package with an elongated container and solder paste formed on the electrode pad according to some embodiments of the invention.

FIG. 9 is a cross-sectional view of a semiconductor chip package with an elongated container and solder paste formed on the electrode pad according to some embodiments of the invention.

Referring to FIG. 9, the external terminal 20 may be formed by printing solder paste 20a onto the substrate 10. Specifically, the solder paste 20 may be printed onto the substrate 10 by a screen printing process or any other conventional process, as is known in the art. The solder paste 20a may substantially surround the elongated container 22 and contact the electrode pad 12 and/or the UBM 18. The solder paste 20a may be exposed to a heating step to form the external terminal 20. The solder paste 20a may comprise conventional solder, lead-free solder, or any other conductive material, as is known in the art.

Figure 10:
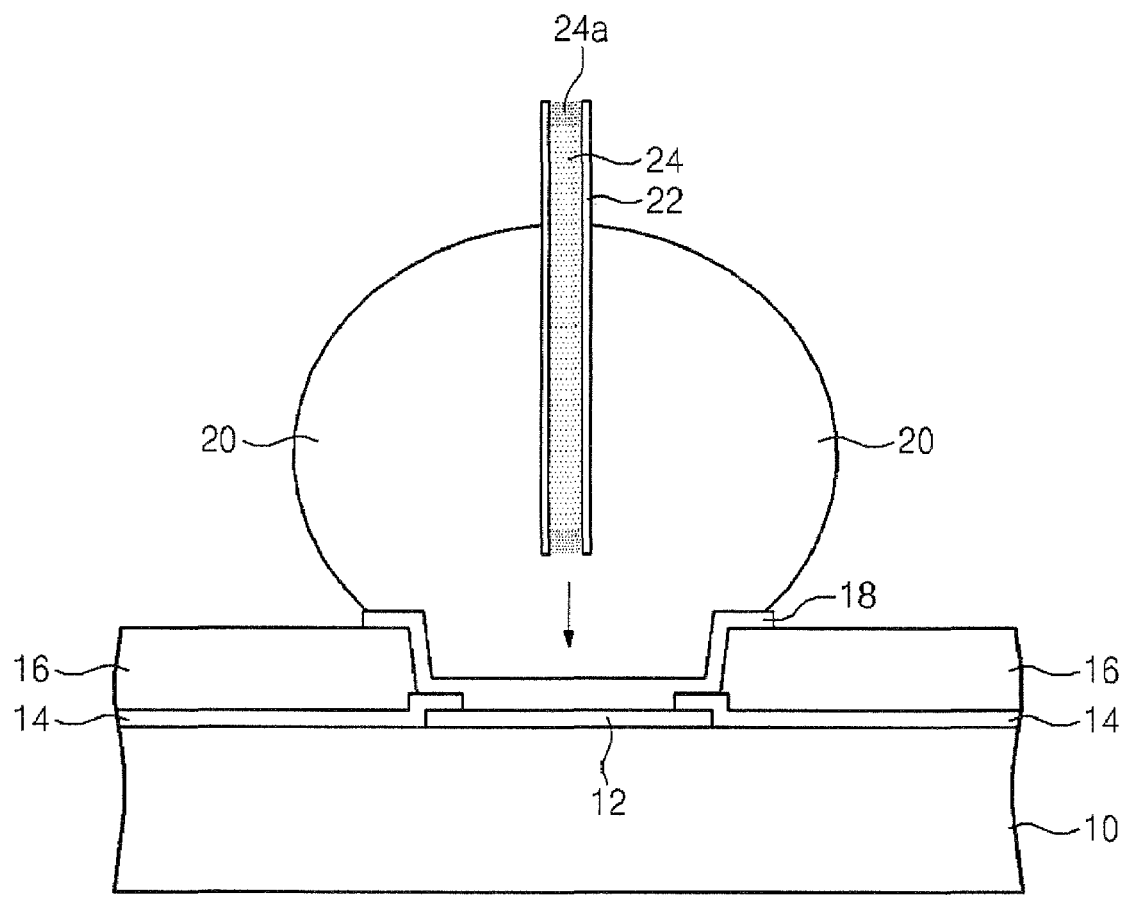
FIG. 10 is a cross-sectional view of a semiconductor chip package with an elongated container inserted into an external electrode formed on the electrode pad according to some embodiments of the invention.

FIG. 10 is a cross-sectional view of a semiconductor chip package with an elongated container inserted into an external terminal formed on the electrode pad according to some embodiments of the invention.

Referring to FIG. 10 and according to some embodiments, the elongated container 22 may be inserted into the solder paste 20a or the external terminal 20 after the solder paste 20a and/or the external terminal 20 are formed on the substrate 10. Specifically, the container 22 may be inserted into the solder paste 20a after the printing process, but before the heating step, or the container 22 may be inserted into the external terminal 20 after the heating step. By controlling the thermal conditions of the external terminal 20, the elongated container 22 may be inserted into the external terminal 20 without damage to the container 22 and without altering the shape of the external terminal 20. The portion 24a of the conductive liquid 24 may be solidified by exposure to air prior to inserting the container 22 into the external terminal 20. Alternatively, the portion 24a may be a different material used to seal the conductive liquid 24 in the container 22 prior to inserting the container 22 into the external terminal 20. For example, a coating process may be performed on the end portion of the container 22 to seal the conductive liquid 24 in the container 22.

Figure 11:
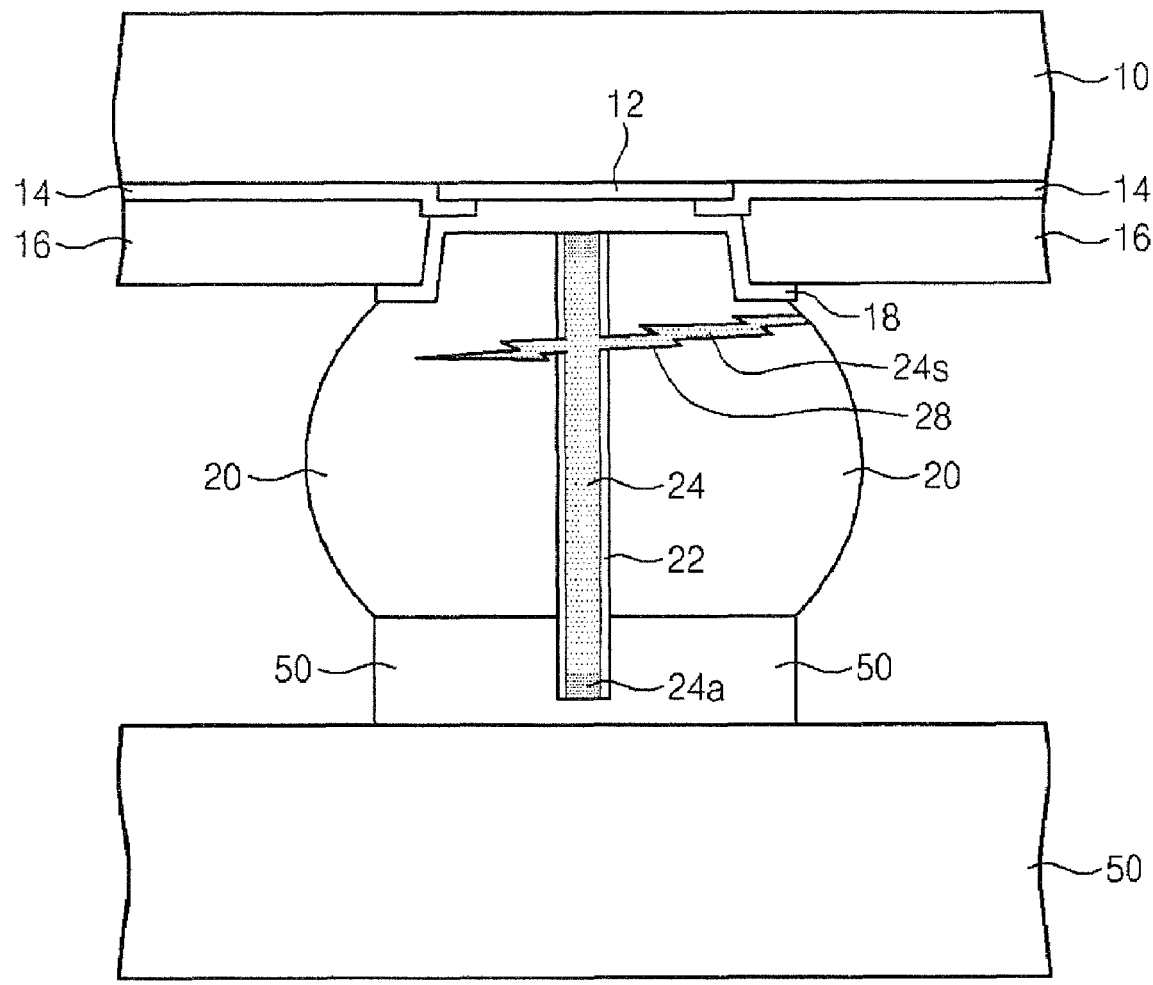
FIG. 11 is a cross-sectional view of a semiconductor chip package joined to a circuit board by an external terminal including a crack in the external terminal according to some embodiments of the invention.

FIG. 11 is a cross-sectional view of a semiconductor chip package joined to a circuit board by an external terminal including a fissure or a crack in the external terminal according to some embodiments of the invention.

Referring to FIG. 11, when an external terminal 20 is exposed to stress, such as during a heating step, a crack or fissure 28 may form in the external terminal 20. Propagation of the crack 28 in the external terminal 20 may be suppressed by the presence of the container 22. Also, the crack 28 may breach the container 22. When the crack 28 breaches the container 22, a portion 24s of the conductive liquid 24 leaves the container 22 and at least partially fills the crack 28. The portion 24s of the conductive liquid 24 may fully fill the crack 28. The portion 24s of the conductive liquid 24 that has left the container 22 may be exposed to air and become solidified to form an electrically conductive material. As a result, the portion 24s of the conductive liquid 24 may seal the crack and restore the mechanical stability of the external terminal 20. Further, the portion 24s of the conductive liquid 24 may restore the resistance characteristic of the external terminal 20 to a level substantially the same as before the occurrence of the crack 28.

As detailed above, embodiments of the present invention provide an external terminal including a container filled with a conductive liquid. Crack propagation within the external terminal is suppressed by the container. Further, if the crack breaches the container, the conductive liquid from the container at least partially fills the crack, improving or restoring the resistance characteristics of the connection. Therefore, connections between chip packages and PCBs according to embodiments of the present invention have improved reliability over conventional methods.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

Further, well-known structures and devices are not shown in order not to obscure the description of the invention with unnecessary detail.

The foregoing is merely illustrative of the invention in its broader aspects and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. For example, although the present invention has been discussed in conjunction with the elongated container, the container may not be elongated or may be elongated in a manner different than that shown in the drawings, as long as the container performs the same function of the described elongated container. Therefore, it is to be understood that the foregoing is illustrative of the invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A semiconductor device comprising:
   a semiconductor substrate;
   an electrode pad disposed on the semiconductor substrate;
   an external terminal disposed on the electrode pad;
   a container extended from the electrode pad into the external terminal; and
   a conductive liquid disposed inside the container,
   wherein the container extends above a top surface of the external terminal.

2. The device of claim 1, wherein the conductive liquid solidifies when exposed to air.

3. The device of claim 1, wherein the conductive liquid has a viscosity in a range of about 10 cps to about 5000 cps.

4. The device of claim 1, wherein the conductive liquid comprises metal.

5. The device of claim 1, wherein the conductive liquid comprises a metal paste, an electrically conductive ink, or a nano-metal solution.

6. The device of claim 1, further comprising an under-bump metallization (UBM) on the electrode pad, and wherein the container directly contacts a top surface of the UBM or the container is embedded in the UBM.

7. The device of claim 1, wherein the container directly contacts the electrode pad.

8. The device of claim 1, wherein the electrode pad comprises a groove and the container extends into the groove.

9. The device of claim 1, further comprising at least one protrusion disposed in the external electrode.

10. The device of claim 9, wherein the at least one protrusion is solid.

11. The device of claim 9, wherein the at least one protrusion comprises a conductive liquid disposed therein.

12. The device of claim 1, further comprising:
    a circuit board; and
    a contact pad disposed between the circuit board and the external terminal corresponding to a location of the electrode pad.

13. The device of claim 12, wherein the contact pad comprises a groove formed therein, and wherein the container extends from the electrode pad, through the external terminal, and into the groove in the contact pad.

14. The device of claim 12, wherein the contact pad comprises a through hole formed therethrough, and wherein the container extends through the through hole.

15. A semiconductor device, comprising:
    a semiconductor substrate;
    an electrode pad disposed on the semiconductor substrate; and
    an external terminal disposed on the electrode pad, wherein the external terminal comprises a conductive liquid disposed in a container extending above a top surface of the external terminal from the electrode pad.

16. The device of claim 15, wherein the container has an elongated shape and is disposed in the external terminal, wherein the conductive liquid is disposed in the elongated container.

17. The device of claim 15, wherein the conductive liquid is configured to solidify when exposed to air.

* * * * *